United States Patent
Hung et al.

(10) Patent No.: US 6,678,581 B2
(45) Date of Patent: Jan. 13, 2004

(54) METHOD OF CALIBRATING A WAFER EDGE GRIPPING END EFFECTOR

(75) Inventors: Kwun-Goo Hung, Changhua (TW); Tung-Li Lee, Hsin-chu (TW); Ko-Chin Chung, Yung-Ho (TW); Fan-Lin Lu, Chung-Ho (TW)

(73) Assignee: Taiwan Semiconductor Manufacturing Co. Ltd, Hsin Chu (TW)

(*) Notice: Subject to any disclaimer, the term of this patent is extended or adjusted under 35 U.S.C. 154(b) by 61 days.

(21) Appl. No.: 10/047,331

(22) Filed: Jan. 14, 2002

(65) Prior Publication Data

US 2003/0135302 A1 Jul. 17, 2003

(51) Int. Cl.$^7$ ................................................ G06F 19/00
(52) U.S. Cl. .................. 700/245; 700/248; 700/249; 700/250; 700/258; 700/259; 700/260; 700/261; 700/262; 700/263; 700/264; 118/500; 118/228; 701/23; 901/30; 901/39
(58) Field of Search ........................ 700/245, 275, 700/248, 249, 250, 259, 260, 261, 262, 263, 264, 258, 900; 118/728, 500; 414/730, 757, 777, 941, 816; 701/23; 901/30, 39

(56) References Cited

U.S. PATENT DOCUMENTS

| | | | |
|---|---|---|---|
| 5,810,935 A | * | 9/1998 | Lee et al. .................. 118/728 |
| 6,256,555 B1 | * | 7/2001 | Bacchi et al. ............... 700/261 |
| 6,275,748 B1 | * | 8/2001 | Bacchi et al. ............... 700/245 |
| 6,366,830 B2 | * | 4/2002 | Bacchi et al. ............... 700/250 |
| 6,438,460 B1 | * | 8/2002 | Bacchi et al. ............... 700/275 |
| 6,453,214 B1 | * | 9/2002 | Bacchi et al. ............... 700/245 |

OTHER PUBLICATIONS

Srinivasan, Modeling and performance analysis of cluster tools using petri nets, 1998, IEEE, pp. 394–403.*

* cited by examiner

*Primary Examiner*—William A. Cuchlinski, Jr.
*Assistant Examiner*—McDieunel Marc
(74) *Attorney, Agent, or Firm*—Tung & Associates

(57) ABSTRACT

A method of calibrating a wafer edge gripping end effector. A wafer calibration tool is held in a stationary position simulating the position of a semiconductor wafer to be picked up by the wafer edge gripping end effector. A controller associated with a robot having an end effector attached to a robot arm thereto is turned off. The robot arm and end effector are moved to position where the first and second clamp structures on the end effector each engage a respective inner edge that in part defines a notch formed in the wafer calibration tool. An actuator driven movable clamp structure is manually advanced so that the movable clamp structure engages an inner edge that in part defines one of the notches formed in the wafer calibration tool. The controller is turned on and data regarding the location of robot arm, end effector and movable clamp structure is stored.

25 Claims, 3 Drawing Sheets

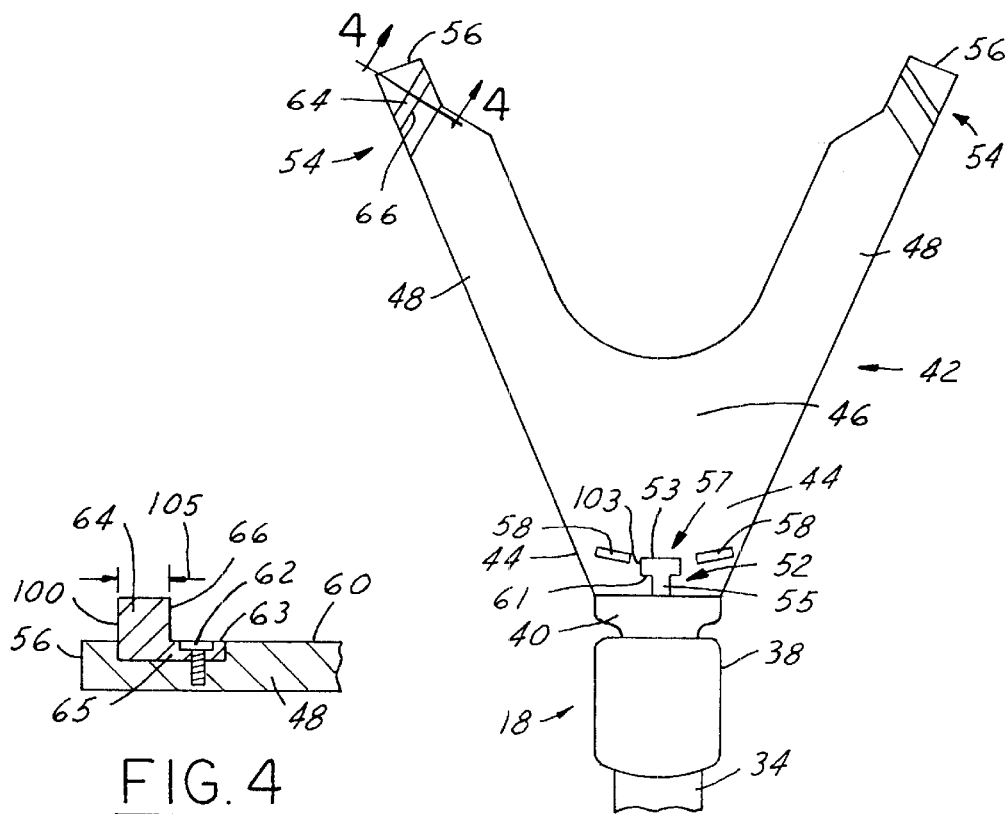
FIG. 4
FIG. 3
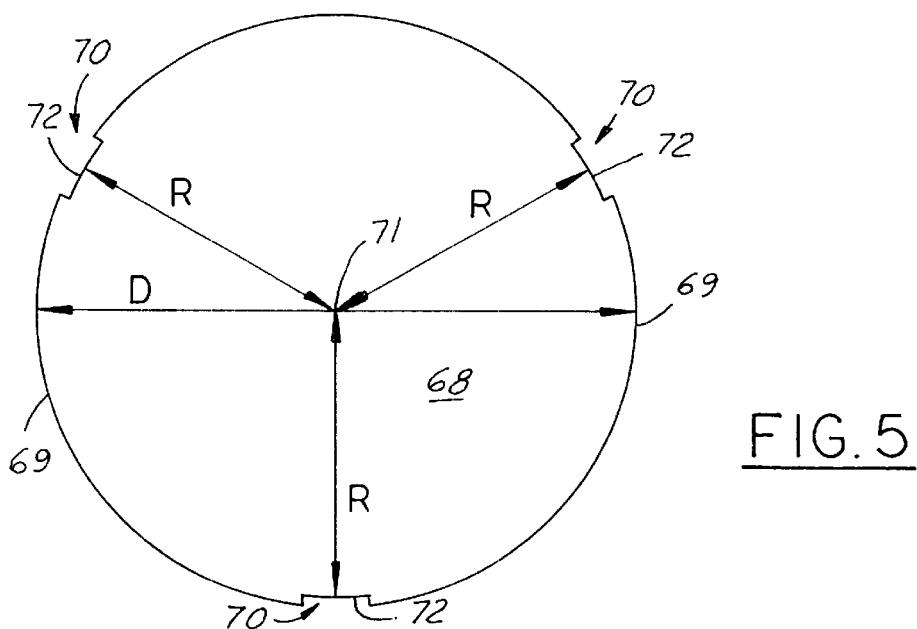
FIG. 5

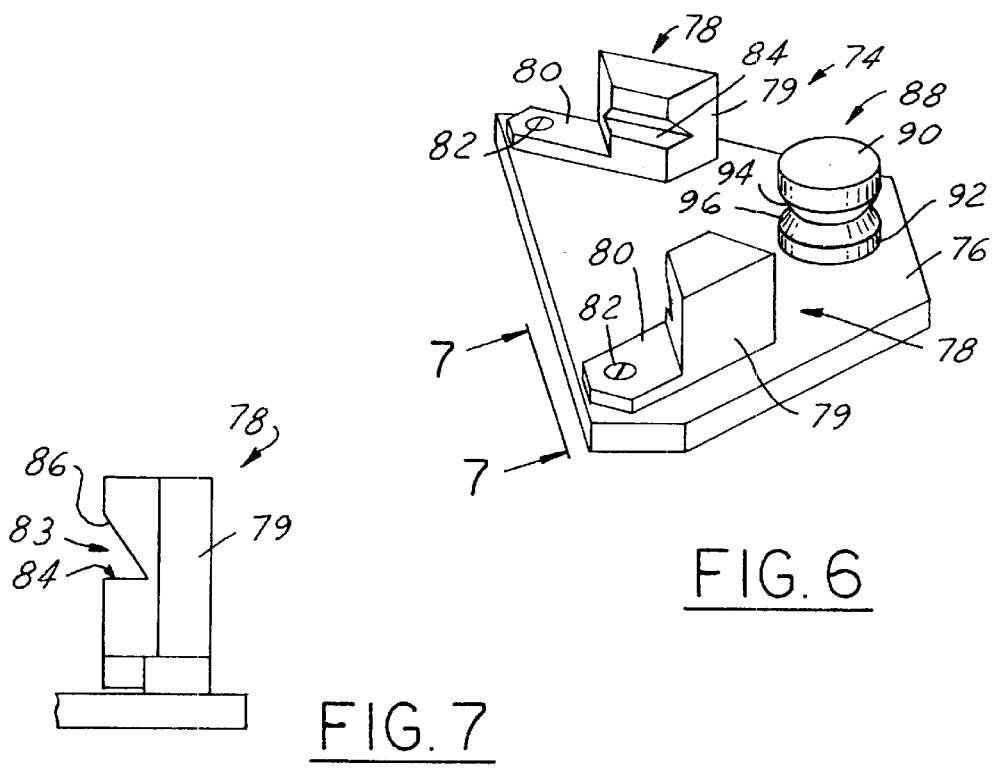
FIG. 6
FIG. 7
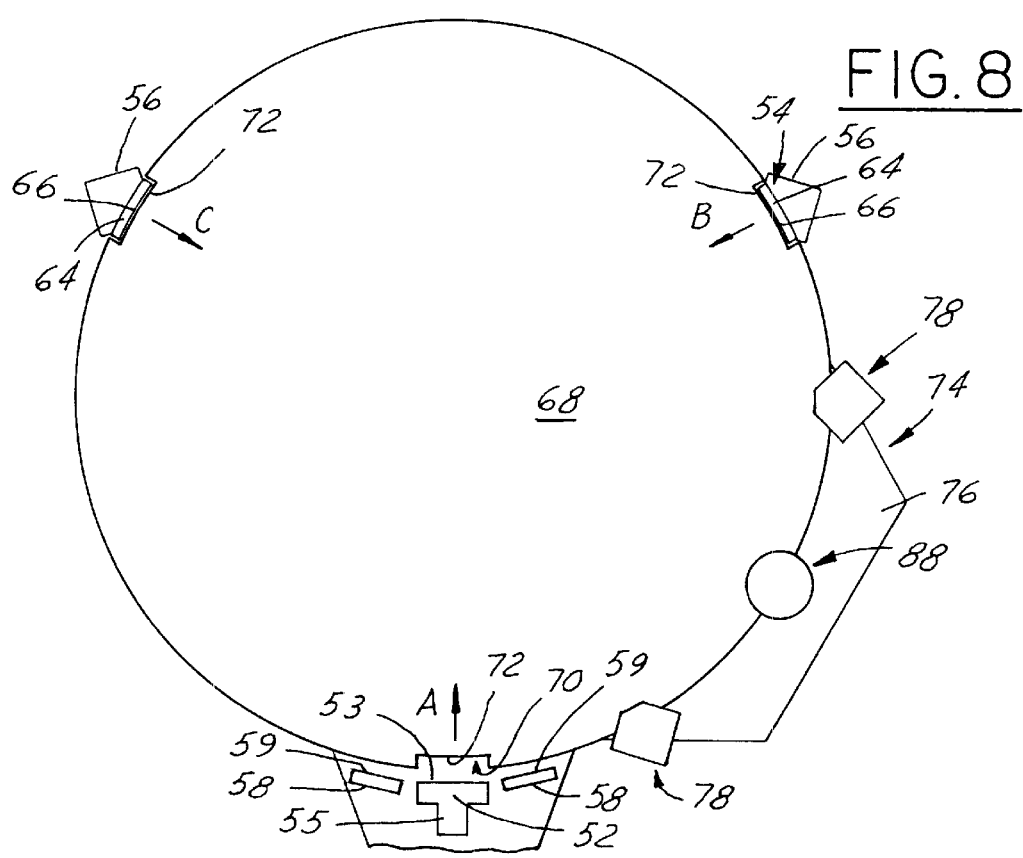
FIG. 8

METHOD OF CALIBRATING A WAFER EDGE GRIPPING END EFFECTOR

FIELD OF THE INVENTION

This invention relates to a method of calibrating a wafer handling system, and more particularly to a method of calibrating a wafer edge gripping end effector.

BACKGROUND OF THE INVENTION

In the fabrication of microelectronic devices such as integrated circuits, an electronic substrate such as a wafer must be processed in numerous processing steps, which in some cases may include as many of several hundred processing steps. During each of the processing step, the silicon wafer must be transported in and out of specific process machines such as an etcher, a physical vapor deposition chamber, a chemical vapor deposition chamber, a wafer cassette, etc. Between the processing steps, a preprocessed wafer is stored in a storage container referred to as a wafer cassette. The wafer cassette is then stored in a container known as a pod to prevent contamination.

The wafer cassette is a device that is normally molded of a plastic material which can be used to store a large number of wafers in a horizontal position. In order to maximize the number of wafers that can be stored in a cassette, the wafers are positioned relatively close to each other. For instance, the pitch distance between the wafers is approximately 2 mm in a normal cassette. The wafers, when stored in the cassette are supported along the wafer edges by molded-in supports on the inner walls of the cassette.

In order to load a wafer into or out of a process machine or wafer cassette, a device known as a wafer transport blade, wand or end effector is typically used. An end effector is a thin piece of material that may be formed in any of a variety of shapes but preferably includes a base portion with extensions commonly known as fingers. An end effector is an attachment to a robot arm that is used to transport silicon wafers, hard drive disk, or flat-panel substrates from one location to another. The end effector can be supplied for vacuum or non-vacuum applications, and may also include wafer edge gripping clamps. An end effector can be made from ceramic materials such as alumina or silicon carbide, or typically is made from a metal such as aluminum.

As indicated earlier, the processing of the silicon wafer involves moving the wafer from a cassette to various processing locations by a robot handling system. The robot handling system includes a mechanism with degrees of freedom in at least radial, angular and vertical directions with the end effector attached to the end of a robot arm. The robot arm must be able to pick up the wafers from the cassette and then transfer them to the designated stations where the wafer undergoes a variety of process steps. The robot mechanism and its associated controller must be programed with the precise location in terms of radial, angular and vertical positions of the wafer in all cassette locations and all processing station locations. A robot mechanism controller, such a central processing unit, includes programmed data to locate and retrieve the wafer precisely from the cassette or processing station.

In a typical wafer processing layout, the locations of various process stations and the cassette stand are known, and the dimensional relationships between the wafer positions in the cassette, each process station location and the robot arm are known within macro-tolerances, for example within 0.05 inches. However, the robot arm must be controlled to move the wafers within extremely close tolerances, that is within micro-tolerances, in order to prevent damage to the robot system including the end effector, wafers, the wafer cassette or other semiconductor processing equipment.

Typically, the robot system is set up and pre-programmed with the location of the wafer positions within the cassette stand, the location of the cassette stand, and other process stations using macro-tolerances. Thereafter, the robot must be programmed or taught so that the robot arm and end effector are precisely positioned during each of the operation steps within micro-tolerances. This is typically accomplished by jogging the robot arm and end effector to each location within the wafer handling process and make adjustments to the robot mechanism and control system. A substantial amount of time and effort is associated in this trial and error technique of calibrating the robot arm. Additional problems are associated with calibrating wafer edge gripping end effectors. The operator must not only correctly position the end effector but must also properly advance a movable clamp structure such as a plunger to engage the side or edge of the wafer. If the plunger is advanced to far or with too much force, the wafer can be damaged. If the plunger is not advanced far enough, this can result in the wafer being dropped by the end effector when moved from one location to another. Once the end effector is properly located for each process handling step, the precise position is then stored in the memory of the wafer handling mechanisms controller.

Further, occasionally a piece of the processing equipment such as a wafer cassette may not be precisely positioned within specifications, or the machine components wear, settle, malfunction, or components are replaced resulting in the robot control arm not being able to move to precisely the correct position for handling the wafer. Often, such situations require the robot mechanism to be reprogrammed to accommodate the new changes and new locations. Again, the trial and error method is used to position the end effector and advance a plunger as a result of the changes in the system. This is also very time-consuming.

Thus it would be desirable to provide a method of calibrating a wafer edge gripping end effector that is accurate, reliable and substantially reduces the time for calibration. The present invention provides alternatives to and advantages over the prior art.

SUMMARY OF THE INVENTION

One embodiment of the invention includes a method for calibrating a wafer edge gripping end effector. The method includes the following acts. Providing a wafer calibration tool that is substantially disc shaped having an outer edge, and a plurality of notches formed therein, wherein each notch is defined in part by an inner edge constructed and arranged to simulate the outer edge of a semiconductor wafer to be gripped by the wafer edge gripping end effector. Providing a robot having a robot arm and a wafer edge gripping end effector connected thereto, and a controller for controlling the movement of the robot arm and the wafer edge gripping end effector. The wafer edge gripping end effector includes a main base portion and a first finger and a second finger each extending from the main base portion and wherein the first and second fingers are spaced apart from each other. Each finger has a free end. A first clamp structure is positioned on the first finger near the free end of the first finger. A second clamp structure is positioned on a second finger near the free end of the second finger. A third clamp structure is also provided. At least one of the first, second and third clamp structures is movable. An actuator for moving the movable clamp structure is provided and wherein the actuator is controlled by the controller. The controller is capable of storing data regarding the position of the robot arm, end effector, and the movable clamp structure, and the controller is capable of being turned on and off. Holding the wafer calibration tool in a stationary positioned simulating the position of the semiconductor to be picked up by the wafer edge gripping end effector. Turning off the controller, and moving the robot arm and end effector to a position wherein the first and second clamp structures each engage a respective inner edge that in part defines one of the notches in the wafer calibration tool. Advancing the movable clamp structure so that the movable clamp structure engages the inner edge that in part define one of the notches in the wafer calibration tool. Turning on the controller and storing data regarding the location of the robot arm, end effector and movable clamp structure.

In another embodiment of the invention the first clamp structure is stationary.

In another embodiment of the invention the second clamp structure is stationary.

In another embodiment of the invention the third clamp structure is movable.

In another embodiment of the invention at least one of the first, second and third clamp structures includes a clamp wall constructed and arranged to be received in one of the notches formed in the wafer calibration tool.

In another embodiment of the invention the clamp wall includes a front face for engaging the inner edge that in part defines one of the notches in the wafer calibration tool, and wherein the front face is substantially straight.

In another embodiment of the invention the clamp wall is completely received in one of the notches formed in the wafer calibration tool.

In another embodiment of the invention at least one of the first, second and third clamp structures includes a bar constructed and arranged to be received in one of the notches formed in the wafer calibration tool.

In another embodiment of the invention the bar is completely received in one of the notches formed in the wafer calibration tool.

In another embodiment of the invention the bar includes an engagement face for engaging the inner edge that in part defines one of the notches in the wafer calibration tool, and wherein the engagement face is substantially straight.

In another embodiment of the invention the wafer calibration tool is generally disc shaped, with the exception of the notches formed therein, and having an outer edge with a diameter greater than a diameter of the semiconductor wafer to be picked up by the wafer edge gripping end effector.

In another embodiment of the invention the distance from the inner edge that in part defines one of the notches in the wafer calibration tool to the center of the wafer calibration tool is approximately the same as the radius of a semiconductor wafer to be picked up by the wafer edge gripping end effector.

Another embodiment of the invention further includes a coupling connecting the robot arm to the end effector, and wherein the movable clamp extends from the coupling.

Another embodiment of the invention includes a method of calibrating a wafer edge gripping end effector including the following acts. Providing a wafer calibration tool that is substantially disc shaped having an outer edge with a plurality of notches formed therein, and wherein each notch is defined in part by an inner edge constructed and arranged to simulate the outer edge of the semiconductor wafer to be gripped by the wafer edge gripping end effector. Providing a robot having a robot arm and a wafer edge gripping end effector connected thereto, and a controller for controlling the movement of the robot arm and the wafer edge gripping end effector. The wafer edge gripping end effector including a main base portion and a first finger extending from the main base portion and the first finger having a free end. A first clamp structure is positioned on the first finger near the free end of the first finger. A second clamp structures also provided. At least one of the first and second clamp structures is movable, and an actuator is provided for moving the movable clamp structure, and the actuator being controlled by the controller. The controller being capable of storing data regarding the position of the robot arm, and effector and movable clamp structure, and the controller being capable of being turned on and off. Holding a wafer calibration tool in a stationary position simulating the position of the semiconductor wafer to be picked up by the wafer edge gripping end effector. Turning off the controller and moving the robot arm and end effector to a position wherein the first clamp structure engages the inner edge that in part defines one of the notches in the wafer calibration tool. Advancing the movable clamp structure so that the movable clamp structure engages the inner edge that in part defines one of the notches in the wafer calibration tool. Turning on the controller and storing data regarding the location of the robot arm, and effector and movable structure.

In another embodiment of the invention the first clamp structure is stationary.

In another embodiment of the invention the second clamp structure is movable.

In another embodiment of the invention at least one of the first and second clamp structures includes a clamp wall constructed and arranged to be received in one of the notches formed in the wafer calibration tool.

In another embodiment of the invention the clamp wall includes a front face for engaging the inner edge that in part defines one of the notches in the calibration tool, and wherein the front face is substantially straight.

In another embodiment of the invention the clamp wall is completely received in one of the notches formed in the wafer calibration tool.

In another embodiment of the invention at least one of the first and second clamp structures includes a bar constructed and arranged to be received in one of the notches formed in the wafer calibration tool.

In another embodiment of the invention the bar is completely received in one of the notches formed in calibration tool.

In another embodiment of the invention the bar includes an engagement face for engaging the inner edge that in part defines one of the notches in the wafer calibration tool, and wherein the engagement face is substantially straight.

In another embodiment of the invention the wafer calibration tool is generally disc shaped, with the exception of the notches formed therein, and having an outer edge with a diameter greater than a diameter of the semiconductor wafer to be picked up by the wafer edge gripping end effector.

In another embodiment of the invention the distance from the inner edge that in part defines one of the notches in the wafer calibration tool to the center of the wafer calibration tool is approximately the same as a radius of the semiconductor wafer to be picked up by the wafer edge gripping end effector.

Another embodiment of the invention further includes a coupling connecting the robot arm to the end effector, and wherein the movable clamp structure extends from the coupling.

These and other objects, features and advantages of the present invention will become apparent from the following brief description of the drawings, detailed description of the preferred embodiments, and appended claims and drawings.

BRIEF DESCRIPTION OF THE DRAWINGS

FIG. 3 is an enlarged view of a wafer handling apparatus, with portions broken away, useful in the present invention;

FIG. 4 is a side view, with portions broken away, showing an end effector finger with a stationary clamp structure useful in a method according to the present invention;

FIG. 5 illustrates a wafer calibration tool for a wafer edge gripping end effector according to the present invention;

FIG. 6 illustrates a wafer calibration tool holding apparatus according to the present invention;

FIG. 7 is a side view of a clamp post of a wafer calibration tool holding apparatus according to the present invention; and FIG. 8 illustrates the use of a wafer calibration tool to calibrate a wafer edge gripping end effector according to the present invention.

DETAILED DESCRIPTION OF THE PREFERRED EMBODIMENTS

Figure 1:
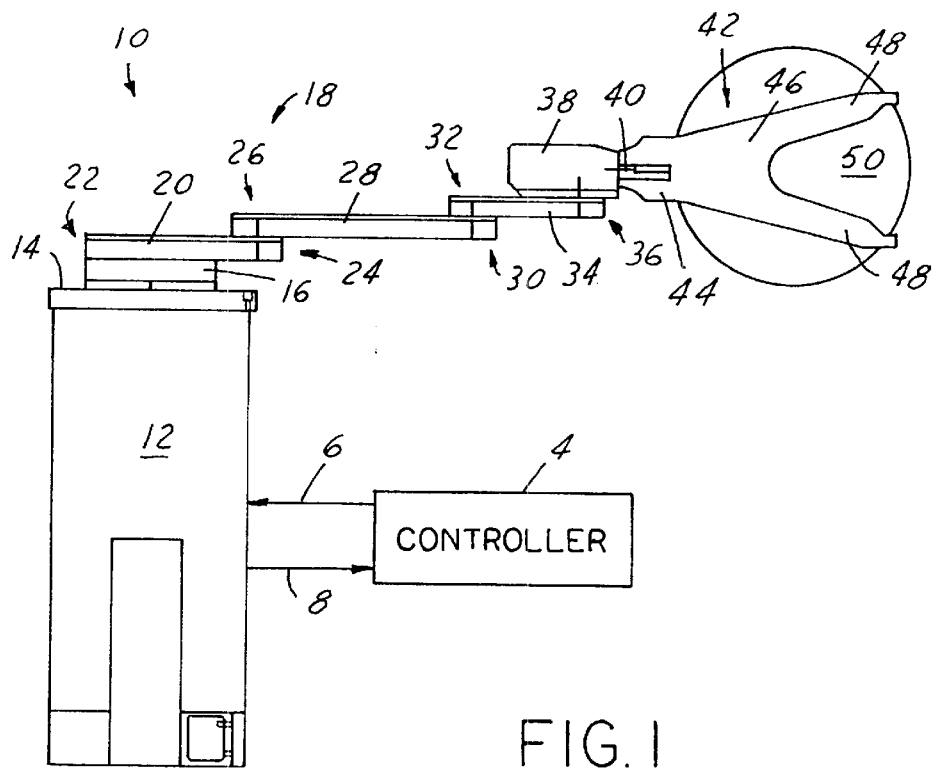
FIG. 1 illustrates a wafer handling apparatus useful in present invention.

FIG. 1 illustrates a wafer handling apparatus useful in the present invention. The wafer handling apparatus 10 includes a main body portion 12 including a plurality of motors (not shown), typically at least three motors, for moving a robot arm 18 in a multitude of directions. Typically the plurality of motors in the main body portion are capable of moving the robot arm 18 in at least radial, angular and vertical directions. A cap 14 is provided on the main body portion 12 through which a piston type actuator 16 travels, driven by one of the motors, to move the robot arm 18 in a vertical direction. The robot arm 18 includes a plurality of arm segments. A first arm segment 20 includes a first end 22 pivotally connected to the top of the piston type actuator 16. A second end 24 of the first arm segment 20 is pivotally connected to a first end 26 of a second arm segment 28. A second end of 30 of the second arm segment 28 is pivotally connected to a first end 32 of a third arm segment 34. A second end 36 of the third arm segment is coupled to an end effector 42 by way of a second actuator 38. The second actuator 38 includes a coupling 40 connected to a necked portion 44 of the end effector 42. The second actuator 38 is constructed and arranged to rotate the end effector 42, and wafer 50 held thereby, 360 degrees about the central axis of the end effector 42. The end effector 42 further includes a main body portion 46 extending from the neck portion 44, and a plurality of fingers 48 extending from the main body portion 46. The wafer handling apparatus 10 also includes a controller 4 for sending signals via line 6 and receiving signals the via line 8 to control the motors and robot arm 18, including the second actuator 38 and actuator driven movable clamp structure 52 (to be described in greater detail hereafter).

Figure 2:
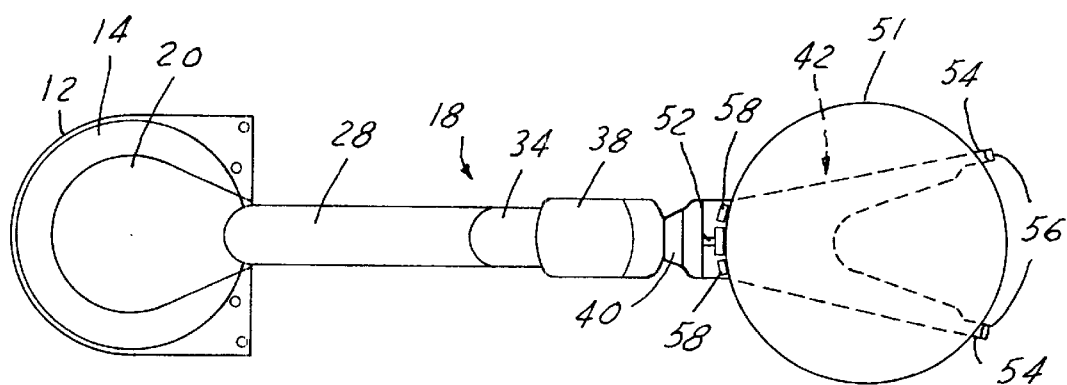
FIG. 2 is a top view of a wafer handling apparatus useful in the present invention.

FIG. 2 is a top view of the wafer handling apparatus shown in FIG. 1. As will be better appreciated from FIG. 2, the end effector 42 includes a plurality of clamping structures 52, 54, and 58 utilized to position and grip the edges of a semiconductor wafer 50. At least one of the clamping structures is movable from a first position spaced away from the outer edge 51 of the semiconductor wafer 50 to a position in engagement with the outer edge 51 and so that the outer edge 51 of the wafer also engages at least one other clamping structure 54. A plurality of the clamping structures may be movable and actuator driven.

FIG. 3 is enlarged view of a wafer handling apparatus, with portions broken away, that is useful in the present invention. As indicated earlier, at least one of the clamping structures 52, as shown in FIG. 3, is movable and may be driven by an actuator housed in the coupling 40 or other portion of the robot arm 18. The end effector 42 includes at least one movable clamp structure 52 and a stationary clamp structure 54 located near a free end 56 of each finger 48 extending from the main body 46 of the end effector 42. However, it is within the scope of this invention that the clamp structures 54 located near the free end 56 of each finger 48 may also be movable and actuator driven. Additional clamp structures 58 may be located adjacent to the movable clamp structure 52 to help align the semiconductor wafer prior to actuation of the movable clamp structure 52 to engage the outer edge 51 of the wafer 50.

As will be better appreciated from FIG. 3, the movable clamping structure 52 preferably includes a rod portion 55 with a bar type structure 57 attached to the end thereof. The bar type structure 57 includes a front engagement face 53 for engaging the outer edge 51 of the semiconductor wafer 50. The bar type structure 57 includes a rear face 61 and a side 103 extending from the rear face 61 to the front engagement face 53. The thickness of the bar type structure 57 being defined by the side 103.

The end effector 42 may have only a single finger 48 extending from a main body portion 46 so that the end effector 42 has a blade-like configuration. In such a configuration, the main body portion 46 and the finger 42 may be a single piece typically of consistent width.

FIG. 4 is a sectional view taken along lines 4—4 of FIG. 3 illustrating a stationary clamp structure 54 located near a free end 56 of the finger 48. The stationary clamp structure 54 may be made from any of a variety of materials including a plastic that is embedded in a cutout formed in the finger 58. The stationary clamp structure 54 may include a clamp wall 64 extending perpendicularly from a flat upper surface of 60 of the finger 48. The stationary clamp structure 54 may also include a leg 65 extending perpendicularly to the clamp wall 64 through which a screw 62 may be used to mount the clamp structure 54 to the finger 48. Preferably the leg 65 includes a top surface 63 that is flush with the top surface 60 of the finger 48. The clamping wall 64 includes a front face 66 for engagement with the outer edge 51 of the semiconductor wafer 50. A front face 66 may be substantially flat so that only a relatively small portion of the front face 66 engages the outer edge 51 of the semiconductor wafer, or the front face 66 may be arcuate shaped to match the outer edge 51 of the disc shaped semiconductor wafer 50. The clamp wall 64 also includes a rear face 100, and a thickness 105 of the clamp wall 64 is defined by the distance between the rear face 100 and the front face 66.

FIG. 5 illustrates a wafer calibration tool 68 according to the present invention. The calibration tool 68 includes a plurality of cutouts or notches 70 formed in an outer edge 69.

The calibration tool 68 is generally disc shaped having a diameter, indicated by line D, as measured between the most outer edges 69 that is slightly greater than the diameter of the semiconductor wafer 50 to be gripped by the end effector 42. Each notch 70 is constructed and arranged to receive one of the clamp structures 52, 54. The notch 70 is defined in part by an inner edge 72 that simulates the outer edge 51 of a semiconductor wafer 50 to be gripped by the end effector 42. A distance, indicated by line R, from the inner edge 72 defined by the notch 70 to the center (71) of the tool 68 is identical to the radius of the semiconductor wafer 50 to be gripped by the end effector 42. Further, the distance between the most outer edge 69 of the tool and the inner edge 72 defined by the notch 70 is equal to the thickness 105 of the clamp wall 64 of the stationary clamping structure 54 or the thickness 103 of the movable clamping structure 52. Accordingly, at least a portion of, and preferably all of the clamp wall 64 of the stationary structure 54 may be received in the notch 70 defined in the tool 68, and likewise at least a portion of the bar and preferably all of bar type structure 57, of the movable clamping structure 52 may be received also in a notch 70 defined in the tool 68.

FIG. 6 is a perspective view illustrating a calibration tool holder 74 for holding the calibration tool 68 in a stationary position. The calibration tool holder 74 may be identical to a holder for the semiconductor wafer such as that which might be found in a cleaner output station. The tool holder 74 typically includes a platform 76 on which a plurality wafer or wafer calibration tool clamping features may be secured. A stationary clamp post 78 may include a post portion 79 extending upwardly above the platform 76 and a leg extension 80 extending outwardly and parallel to the platform 76 through which a screw 82 may be utilized to secure the stationary clamp post to the platform 76. The post portion 79 may have a notch 83 (best shown in FIG. 7) formed therein to define a flat surface 84 constructed and arranged to support the calibration tool (or wafer) in a horizontal position. The calibration tool holder 74 also may include an adjustable clamp structure 88 including a movable first part 90 and a stationary second part 92. The adjustable clamp structure 88 is constructed and arranged so that the movable first part 90 may be moved vertically away from the stationary second part 92 to receive a wafer 50 or the wafer calibration tool 68 between the movable first part 90 and the stationary second part 92. Thereafter the movable first part 90 is moved toward the stationary second part 92 to clamp onto the wafer 50 or calibration tool 68. A spring loaded post or a threaded post (that shown) may extend between the movable first part 90 and the stationary second part 92 to accomplish this purpose.

FIG. 8 illustrates the wafer calibration tool 68 secured in a stationary position by the holder 74. Once the wafer calibration tool 88 is held in a stationary position simulating a wafer pickup position such as the position a wafer might be in a cleaner output station. The controller for the wafer handling apparatus 10 is turned off and the robot arm is manually move so that the clamp wall 64 of each of the stationary clamp structures 54 on the ends of the end effector fingers are each received in a respective notch 70 formed in the calibration tool 68 and so that the front face 66 of the clamp wall 64 engages the inner edge 72 (that simulates the outer and 51 of the semiconductor wafer 50) of the calibration tool 68. The movable clamp structure 52 is advanced (in the direction indicated by line A) so that the engagement face 53 engages the inner edge 72 that defines in part one of the notches 70 formed in the calibration tool 68. Because the calibration tool 68 is firmly held in a stationary position by the holder 74, the clamping features 54 and 52 may be brought into exact contact with the inner edge 72 that simulates the outer edge 51 of a semiconductor wafer 50 without the substantial trial and error associated with prior art methods. Once the clamp structures 52 and 54 precisely engage an inner edge 72 of the calibration tool, the controller is turned on and the position of the end effector and the movable clamping structure 52 is saved in the memory of the controller as the precise position for gripping the outer edge 51 of a semiconductor wafer 50 to pick the wafer up from the specific position desired, in this case the position of the wafer in the cleaner output station.

What is claimed is:

1. A method of calibrating a wafer edge gripping end effector comprising:

providing a wafer calibration tool that is substantially disc shaped having an outer edge with a plurality of notches formed therein, wherein each notch is defined in part by an inner edge constructed and arranged to simulate the outer edge of a semiconductor wafer to be gripped by a wafer edge gripping end effector;

providing a robot having a robot arm and a wafer edge gripping end effector connected thereto, and a controller for controlling the movement of the robot arm and the wafer edge gripping end effector, and wherein the wafer edge gripping end effector includes a main base portion and a first finger and a second finger each extending from the main base portion and wherein the first and second fingers are spaced apart from each other, and wherein each finger has a free end, and a first clamp structure position on the first finger near the free end of the first finger, and a second clamp structure positioned on the second finger near the free end of the second finger, and a third clamp structure, and wherein at least one of the first, second and third clamp structures is movable, and an actuator for moving the movable clamp structure, and wherein the actuator is controlled by the controller, and the controller having a memory for storing data regarding the position of the robot arm, end effector, and movable clamp structure, and the controller constructed and arranged to be turned on and off;

holding the wafer calibration tool in a stationary position simulating the position of a semiconductor wafer to be picked up by the wafer edge gripping end effector;

turning off the controller;

moving the robot arm and end effector to a position wherein the first and second clamp structures each engage a respective inner edge that in part defines one of the notches in the wafer calibration tool;

advancing the movable clamp structure so that the movable clamp structure engages an inner edge that in part defines one of the notches in the wafer calibration tool;

turning on the controller and storing data in the memory regarding the location of the robot arm, end effector, and movable clamp structure.

2. A method as set forth in claim 1 wherein the first clamp structure is stationary.

3. A method as set forth in claim 1 wherein the second clamp structure is stationary.

4. A method as set forth in claim 1 wherein the third clamp structure is movable.

5. A method as set forth in claim 1 wherein at least one of the first, second and third clamp structures includes a clamp wall constructed and arranged to be received in one of the notches formed in the wafer calibration tool.

6. A method as set forth in claim 5 wherein the clamp wall includes a front face for engaging the inner edge that in part defines one of the notches in the calibration tool, and wherein the front face is substantially straight.

7. A method as set forth in claim 5 wherein the clamp wall is completely received in one of the notches formed in a wafer calibration tool.

8. A method as set forth in claim 1 wherein at least one of the first, second and third clamp structures includes a bar constructed and arranged to be received in one of the notches formed in the wafer calibration tool.

9. A method as set forth in claim 8 wherein the bar is completely received in one of the notches formed in the wafer calibration tool.

10. A method as set forth in claim 8 wherein the bar includes an engagement face for engaging the inner edge that in part defines one of the notches formed in the wafer calibration tool, and wherein the engagement face is substantially straight.

11. A method as set forth in claim 1 wherein the outer edge of the wafer calibration tool has diameter greater than the diameter of a semiconductor wafer to be picked up by the wafer edge gripping end effector.

12. A method as set forth in claim 1 wherein the distance from the inner edge that in part defines one of the notches in the wafer calibration tool to the center of the wafer calibration tool is approximately the same as the radius of a semiconductor wafer to be picked up by the wafer edge gripping end effector.

13. A method as set forth in claim 1 further comprising a coupling connecting the robot arm to the end effector, and wherein the movable clamp structure extends from the coupling.

14. A method of calibrating a wafer edge gripping end effector comprising:

providing a wafer calibration tool that is substantially disc shaped having an outer edge with a plurality of notches formed therein, wherein each notch is defined in part by an inner edge constructed and arranged to simulate the outer edge of a semiconductor wafer to be gripped by a wafer edge gripping end effector;

providing a robot having a robot arm and a wafer edge gripping end effector connected thereto, and a controller for controlling the movement of robot arm and the wafer edge gripping end effector, and wherein the wafer edge gripping end effector includes a main base portion and a first finger extending from the main base portion, and the first finger having a free end, and a first clamp structure positioned on the first finger near the free end of the first finger, and a second clamp structure, and wherein at least one of the first and second clamp structures is movable, and an actuator for moving the movable clamp structure, and wherein the actuator is controlled by the controller, and the controller having a memory for in the memory storing data regarding the position of the robot arm, end effector, and the movable clamp structure, and the controller being capable of being turned on and off;

holding the wafer calibration tool in a stationary position simulating the position of a semiconductor wafer to be picked up by the wafer edge gripping end effector;

turning off the controller;

moving the robot arm and end effector to position wherein the first clamp structure engages the inner edge that in part defines one of the notches in the wafer calibration tool;

advancing the movable clamp structure so that the movable clamp structure engages the inner edge that in part defines one of the notches in the wafer calibration tool;

turning on the controller and storing data regarding the location of the robot arm, end effector, and movable clamp structure.

15. A method as set forth in claim 14 wherein the first clamp structure is stationary.

16. A method as set forth in claim 14 wherein the second clamp structure is movable.

17. A method as set forth in claim 14 wherein at least one of the first and second clamp structures includes a clamp wall constructed and arranged to the received in one of the notches formed in the wafer calibration tool.

18. A method as set forth in claim 17 wherein the clamp wall includes a front face for engaging the inner edge that in part defines one of the notches in the calibration tool, and wherein the front face is substantially straight.

19. A method as set forth in claim 17 wherein the clamp wall is completely received in one of the notches formed in the wafer calibration tool.

20. A method as set forth in claim 14 wherein at least one of the first and second clamp structures includes a bar constructed and arranged to the received in one of the notches formed in the wafer calibration tool.

21. A method as set forth in claim 20 wherein the bar is completely received in one of the notches formed in the wafer calibration tool.

22. A method as set forth in claim 20 wherein the bar includes an engagement face for engaging the inner edge that in part defines one of the notches in the wafer calibration tool, and wherein the engagement face is substantially straight.

23. A method as set forth in claim 14 wherein the outer edge of the wafer calibration tool has a diameter greater than a diameter of a semiconductor wafer to be picked up by the wafer edge gripping end effector.

24. A method as set forth in claim 14 wherein the distance from the inner edge that in part defines one of the notches in the wafer calibration tool to the center of the wafer calibration tool is approximately the same as the radius of a semiconductor wafer to be picked up by the wafer edge gripping end effector.

25. A method as set forth in claim 14 further comprising a coupling connecting the robot arm to the end effector, and wherein the movable clamp structure extends from the coupling.

* * * * *